United States Patent [19]

Archer

[11] Patent Number: 5,311,115

[45] Date of Patent: May 10, 1994

[54] ENHANCEMENT-DEPLETION MODE CASCODE CURRENT MIRROR

[75] Inventor: Donald M. Archer, Sunnyvale, Calif.

[73] Assignee: National Semiconductor Corp., Santa Clara, Calif.

[21] Appl. No.: 104,827

[22] Filed: Aug. 11, 1993

Related U.S. Application Data

[63] Continuation of Ser. No. 853,523, Mar. 18, 1992, abandoned.

[51] Int. Cl.$^5$ .............................................. G05F 3/16
[52] U.S. Cl. .................................. 323/315; 323/313; 307/296.6
[58] Field of Search ............... 323/313, 314, 312, 315; 307/296.1, 296.6, 296.7, 296.8

[56] References Cited

U.S. PATENT DOCUMENTS

| | | | |
|---|---|---|---|
| 4,241,315 | 12/1980 | Patterson, III et al. | 330/261 |
| 4,365,172 | 12/1982 | Prater | 307/270 |
| 4,654,578 | 3/1987 | Salerno et al. | 323/313 |
| 4,829,231 | 5/1989 | Coupe et al. | 323/315 |
| 4,855,618 | 8/1989 | Brokaw | 307/296.6 |

FOREIGN PATENT DOCUMENTS

| | | |
|---|---|---|
| 0183185 | 11/1985 | European Pat. Off. |
| 0414400 | 8/1990 | European Pat. Off. |
| 2209254 | 8/1987 | United Kingdom |

OTHER PUBLICATIONS

High-Swing MOS Current Mirror with Arbitrarily High Output Resistance P. J. Crawley et al., Electronic Letters, No. 4.
O. H. Schade, Jr., "Advances in BiMOS Integrated Circuits", RCA Review, vol. 39, Jun. 1978, pp. 250-277.
Y. P. Tsvidis, Design Considerations in Single-Channel MOS Analog Integrated Circuits-A Tutorial, IEEE Journal of Solid-State Circuits, vol. SC-13, No. 3, Jun. 1978, pp. 383-391.
G. R. Wilson, A Monolithic Junction FET-n-p-n Operational Amplifier, IEEE Journal of Solid-State Circuits, vol. SC-3, No. 4, Dec. 1968, pp. 341-347.
R. J. Widlar, Some Circuit Design techniques for Linear Integrated Circuits, IEEE Transactions on Circuit Theory, vol. CT-12, No. 4, Dec. 1965, pp. 586-590.
P. R. Gray, Basic MOS Operational Amplifier Design-An Overview, Analog Mos Integrated Circuits, IEEE Press, N.Y., 1980, pp. 28-49.
P. R. Gray and R. G. Meyer, MOS Operational Amplifier Design-A Tutorial Overview IEEE Journal of Solid-State Circuits, vol. SC-17, No. 6, Dec. 1982, pp. 969-982.
Alan B. Grebene, Bipolar and MOS Analog Integrated Circuit Design, John Wiley & Son, 1984, pp. 219-239, 263-303, 709-718.
R. Gieger, P. Allen and N. Strader, VLSI Design Techniques for Analog and Digital Circuits, McGraw-Hill, 1990, p. 352.

*Primary Examiner*—Emanuel T. Voeltz
*Assistant Examiner*—Adolf Berhane
*Attorney, Agent, or Firm*—Steven F. Caserza

[57] ABSTRACT

An improved current source having high output impedance, low saturation voltage, and less sensitivity to process parameters is achieved by having enhancement P-channel transistor devices used as current mirror, while depletion P-channel transistor devices are provided as the cascode devices. A "diode connected" depletion device may be inserted between the enhancement gate and the drain of the current reference transistor to reduce saturation voltage. The "diode connected" depletion device keeps the drains of the enhancement devices at a similar voltage even when the enhancement and depletion device threshold, i.e. $V_T$, do not track over temperature or process. Thus, the current mirror circuit provides not only higher output impedance, lower saturation voltage, but is also less sensitive to process variation.

18 Claims, 7 Drawing Sheets

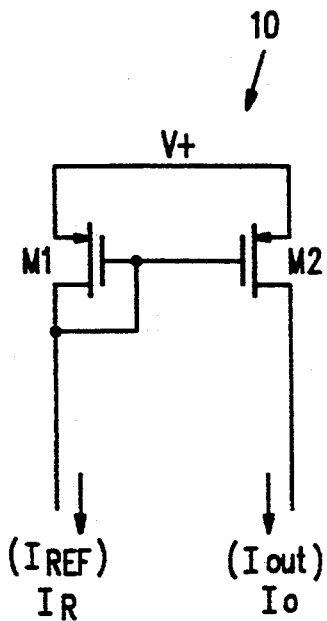
PRIOR ART
FIG. 1
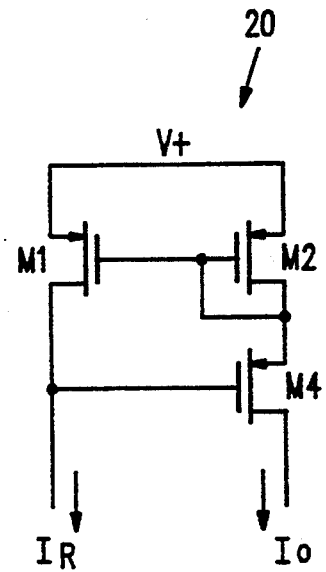
PRIOR ART
FIG. 2 (WILSON)
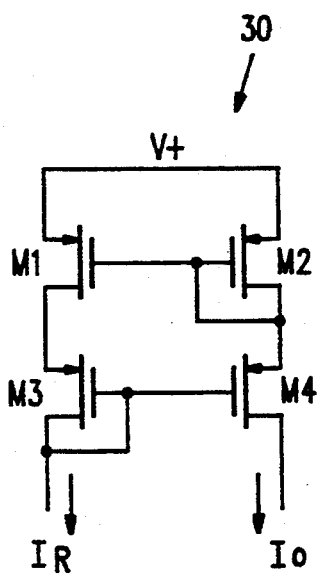
PRIOR ART
FIG. 3 (MODIFIED WILSON)
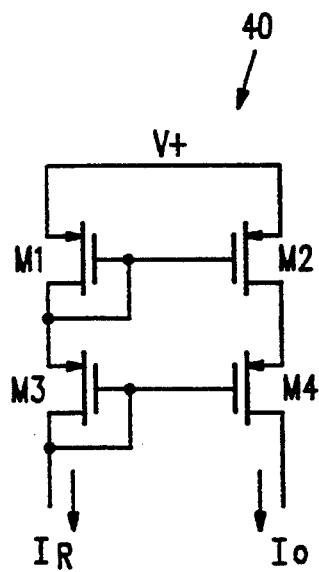
PRIOR ART
FIG. 4 (CASCADE MIRROR)

ENHANCEMENT-DEPLETION MODE CASCODE CURRENT MIRROR

CROSS REFERENCE TO RELATED APPLICATIONS

This application is a continuation of U.S. application Ser. No. 07/853,523, filed Mar. 18, 1992 now abandoned.

TECHNICAL FIELD

This invention relates to current source circuits, particularly to MOS current mirrors.

BACKGROUND

Current mirrors are well known, and prior art current mirror designs have been implemented both in bipolar and MOS circuit technology. FIG. 1 illustrates an example of a typical prior art P channel MOS current mirror. Ideally, the function of current mirror 10 is to match channel current $I_O$ through transistor $M_2$, to channel current $I_R$ through transistor $M_1$, in order that current $I_O$ "mirrors" current $I_R$. In current mirror 10, diode-connected MOS transistor $M_1$ is in saturation, since $V_{DS1} \geq V_{GS1}$. With the gate of transistor $M_2$ connected to the gate of transistor $M_1$, and the sources of transistors $M_1$ and $M_2$ connected, the gate-to-source voltages of transistors $M_1$ and $M_2$ are equal ($V_{GS2} = V_{GS1}$). Therefore transistor $M_2$ also operates in saturation with channel current $I_O$ through transistor $M_2$ equal to channel current $I_R$ through transistor $M_1$. This is true for devices operating both above threshold ($V_{GS} \geq V_T$) and in the subthreshold region ($V_{GS} < V_T$). For devices operating above threshold, current $I_R$ through transistor $M_1$ is expressed as:

$$I_R = \left(\frac{u_{o1}C_{ox1}}{2}\right)\left(\frac{W_1}{L_1}\right)(V_{GS1} - V_{TH1})^2 \left(1 + \frac{V_{DS}}{V_A}\right) \quad (1)$$

and current $I_O$ is expressed as $$I_O = \left(\frac{u_{o2}C_{ox2}}{2}\right)\left(\frac{W_2}{L_2}\right)(V_{GS2} - V_{TH2})^2 \left(1 + \frac{V_{DS}}{V_A}\right) \quad (2)$$

where $V_A$ is due to channel modulation (Early Voltage).

Transistors on the same integrated circuit are fabricated simultaneously and thus transistors $M_1$ and $M_2$ have essentially identical process parameters $V_{TH}$, $u_o$, $C_{ox}$, etc. Moreover, with $V_{GS2} = V_{GS1}$ due to the circuit connection shown in FIG. 1, the current matching ratio of $I_O$ to $I_R$ may be expressed in simplified terms as $$\frac{I_O}{I_R} = \frac{W_2/L_2}{W_1/L_1} \quad (3)$$

where
- $W_1$ = channel width of transistor $M_1$;
- $W_2$ = channel width of transistor $M_2$;
- $L_1$ = channel length of transistor $M_1$; and
- $L_2$ = channel length of transistor $M_2$.

Thus, the task of selecting a desired $I_O/I_R$ current ratio is simplified to selecting transistor geometry in accordance with Equation (3). Typically, $L_1 = L_2$ in order to avoid matching problems, and thus $$\frac{I_O}{I_R} = \frac{W_2}{W_1} \quad (4)$$

However, factors such as channel length modulation;

$$\left(1 + \frac{V_{DS}}{V_A}\right), \quad (5)$$

threshold voltage mismatch between transistors $M_1$ and $M_2$, and imperfect matching of transistor geometry also result in deviation from the ideal current ratio $I_O/I_R$.

The higher the output resistance $R_O$ of a current source, the more perfect it is. Output resistance is proportional to channel length. Ideally $R_O = \infty$, in that the output current will remain constant for varying output voltages. $I_O$ may also fluctuate due to the fact that $V_{DS}(M_1)$ need not necessarily equal $V_{DS}(M_2)$. Thus, the modulation of drain current as the drain voltage varies causes a variation of $I_O$:

$$\left(1 + \frac{V_{DS}}{V_A}\right)I_O = I_O' \quad (6)$$

FIG. 2 shows a prior art P channel current mirror commonly known as the "Wilson current mirror." Utilizing negative feedback, Wilson current mirror 20 provides an increased output resistance as compared with current mirror 10 of FIG. 1. In FIG. 2, the sources of transistors $M_1$ and $M_2$ are connected together to positive supply voltage V+, and the gates of transistors $M_1$ and $M_2$ are connected together. Therefore, the source-gate voltage of transistors $M_1$ and $M_2$ are equal. The gate and drain of transistor $M_2$ are connected together, forcing transistor $M_2$ into saturation. Transistor $M_1$ therefore mirrors the current flow through transistor $M_2$ or, since $I_R$ is made to flow through transistor $M_1$, current $I_O$ flowing through the channel of transistor $M_2$ equals $I_R$. Transistor $M_4$ isolates the drain of transistor $M_2$ from the voltage applied to the drain of transistor $M_4$, thereby preventing any variation in $M_4$ drain voltage from affecting current $I_O$. Also, transistor $M_4$ provides negative feedback to current mirror 20, thereby providing a high output resistance.

FIG. 3 shows a prior art improved Wilson current mirror 30. Current mirror 30 operates similarly to current mirror 20 of FIG. 2, and the addition of transistor $M_3$ matches $V_{DS1}$ to $V_{DS2}$. This provides an improvement as compared with the Wilson current mirror of FIG. 2 in that the Wilson current mirror 20 allows $V_{DS1}$ to be different than $V_{DS2}$, providing another source of error.

FIG. 4 shows another well known current mirror commonly known as a cascode current mirror. Cascode current mirror 40 minimizes variations in $I_O/I_R$ due to output resistance $R_O$. Cascode current mirror 40 is, in effect, a cascade series of 2 current mirror 10 of FIG. 1. In the configuration shown in FIG. 4, assuming all operational parameters of transistors $M_1$ through $M_4$ are identical, i.e. the threshold voltages of the devices are identical and $L_1 = L_2$; $L_3 = L_4$; $W_2/W_1 = W_4/W_3$, drain voltage $V_{D1}$ of transistor $M_1$ equals drain voltage $V_{D2}$ of transistor $M_2$. If there is a voltage fluctuation increasing the drain voltage of transistor $M_4$, drain current $I_O$ through transistors $M_2$ and $M_4$ remains relatively constant. Current ratio $I_O/I_R$ is thus maintained. Table 1 shows the minimum saturation voltage ($V_{satmin}$) of each of the current mirrors of FIGS. 1–4. The current mirror of FIG. 1, being the simplest, has the lowest $V_{satmin}$ equal to simply $dV_2$, where $dV=(V_{GS1}-V_{T1})$, and $dV$ is the overdrive voltage above the threshold voltage $V_T$. All of the remaining current mirror of FIGS. 2–4, being more complex, result in greater $V_{satmin}$, a distinct disadvantage. However, this is the tradeoff for achieving a high output impedance as provided in the current mirrors of FIGS. 2–4.

FIGS. 5–10 depict additional prior art current mirrors which attempt to achieve high output resistances and a relatively low $V_{satmin}$, although necessarily resulting in a $V_{satmin}$ greater than the $V_{satmin}$ of current mirror 10 of FIG. 1. Furthermore, the prior art current mirrors of FIGS. 5–10 require an additional reference current or are unduly affected by process variations and changes in operating temperature. Therefore, it is desirable to provide a more efficient current source circuit which provides high output impedance, low saturation voltage, and which is unaffected by process variations and changes in temperature.

SUMMARY OF THE INVENTION

An improved current source having high output impedance, low minimum saturation voltage, and less sensitivity to process parameters is achieved by having enhancement mode P channel transistor devices used as current mirror transistors, while a depletion mode P channel transistor is provided as the cascode device. A diode connected depletion transistor may be inserted between the gate and drain of the enhancement mode current reference transistor to provide additional reduction in effective saturation voltage as compared with the use of a diode connected enhancement transistor. The diode connected depletion device keeps the drains of the enhancement devices at a similar voltage even when the enhancement mode and depletion mode device thresholds, i.e. $V_T$ enhancement, does not track $V_T$ depletion over temperature or process. Thus, the current mirror circuit provides not only higher output impedance, lower minimum saturation voltage, but is also less sensitive to process variation.

BRIEF DESCRIPTION OF THE DRAWINGS

FIG. 1 shows an example of a prior art basic current mirror circuit;

FIG. 2 shows an example of a prior art Wilson current mirror circuit in MOS technology;

FIG. 3 shows an example of a prior art improved Wilson current mirror circuit;

FIG. 4 shows an example of a prior art cascode current mirror circuit;

DESCRIPTION OF SPECIFIC EMBODIMENTS

Figure 5:
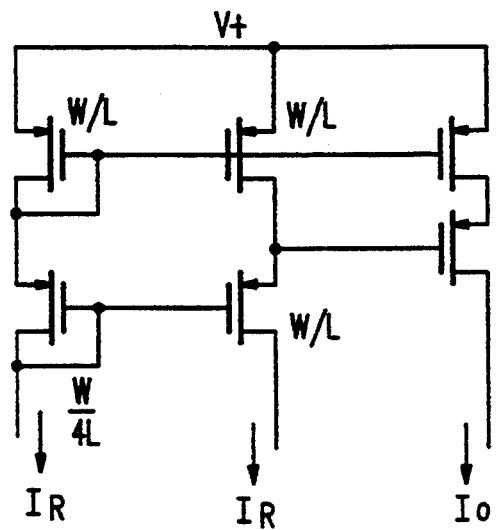
FIGS. 5–10 show other prior art current mirrors.
Figure 6:
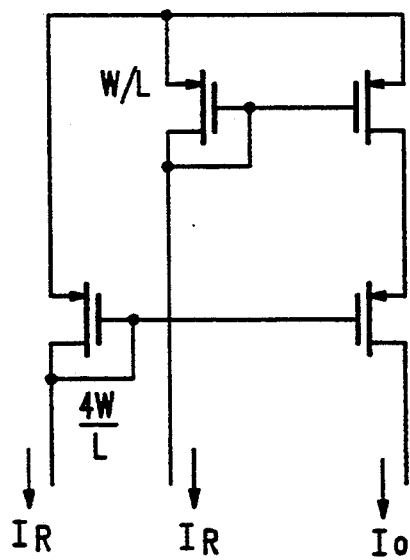
Figure 7:
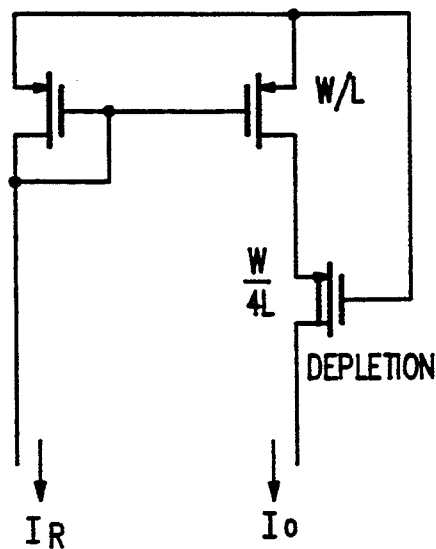
Figure 8:
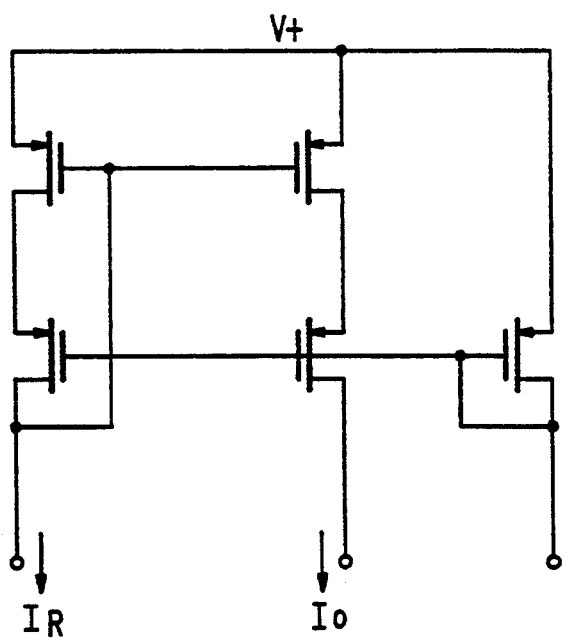
Figure 9:
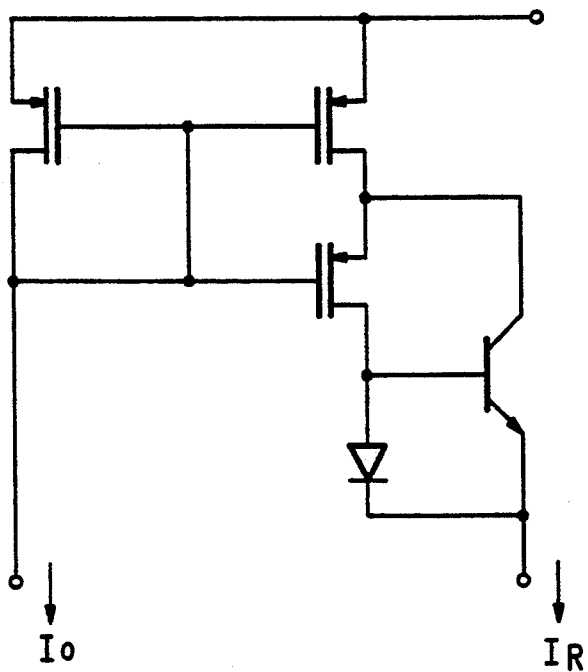
Figure 10:
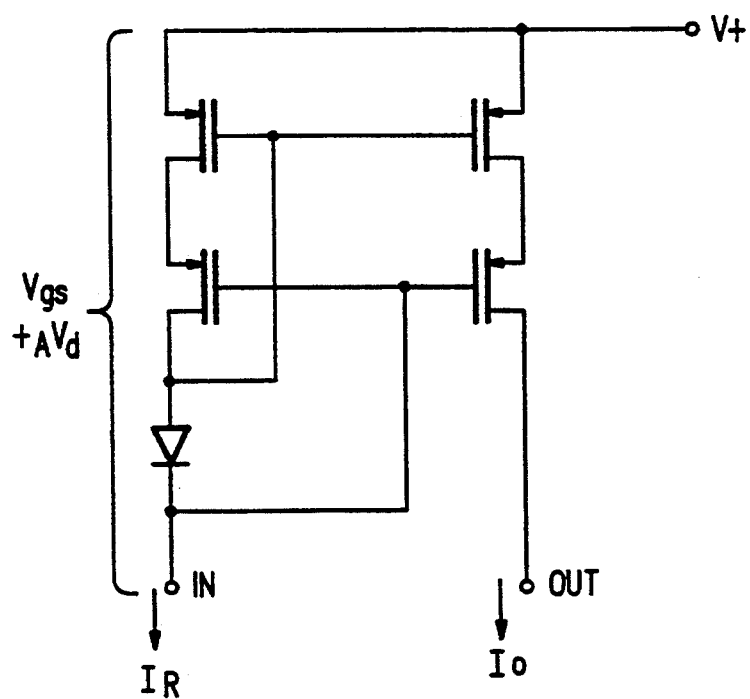
Figure 11:
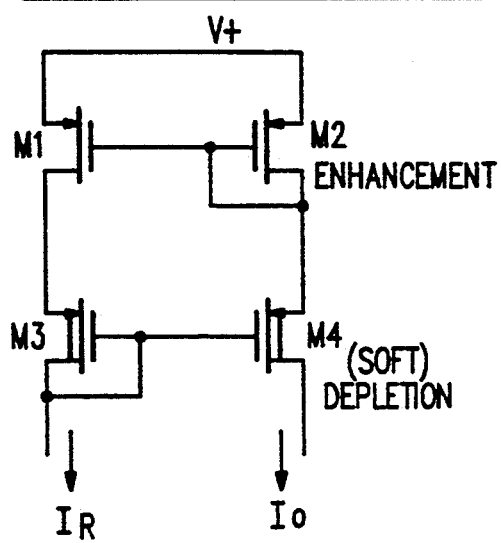
FIGS. 11–13 show various embodiment of an enhancement-depletion mode cascode current mirror constructed in accordance with the principles of this invention.

FIG. 11 is a schematic diagram of one embodiment of a current mirror constructed in accordance with the teachings of this invention. Unlike the modified Wilson current mirror described in FIG. 3, in accordance with this embodiment of this invention, transistor devices $M_3$ and $M_4$ are soft depletion devices, while transistors $M_1$ and $M_2$ remain enhancement devices. In this context, a "soft depletion" device is a P channel device having a threshold voltage on the order of 0 volts or a slightly positive threshold voltage, say for example approximately 0.3 volts. Thus, the minimum saturation voltage $V_{satmin}$ for the embodiment of FIG. 11 is equal to $V_{satmin}=V_{td}+dV_{dep}+dV_{enh}$. However, with $V_{td}$ equal to 0 or a slightly positive voltage, $V_{satmin}$ is within the range of approximately 2 $dV$, thereby providing a novel current mirror having a high output resistance and a significantly reduced $V_{satmin}$ as compared with the prior art high output resistance current mirrors. Furthermore, being a relatively straightforward circuit, it is not only compact but is also substantially unaffected by variations in process or changes in operating temperature.

Figure 12:
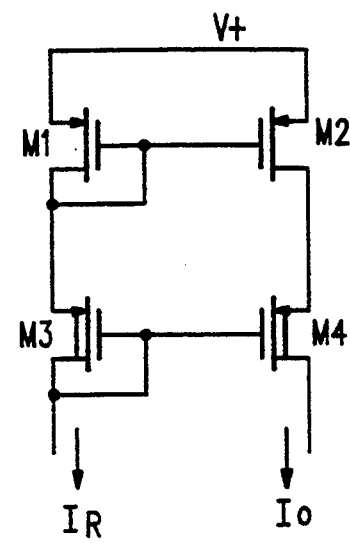

FIG. 12 is a schematic diagram of another embodiment of a current mirror constructed in accordance with the teachings of this invention. Unlike the cascode current mirror described in FIG. 4, in accordance with this embodiment of this invention, transistor devices $M_3$ and $M_4$ are soft depletion devices, while transistors $M_1$ and $M_2$ remain enhancement devices. The minimum saturation voltage $V_{satmin}$ for the embodiment of FIG. 12 is the same as previously described with respect to the embodiment of FIG. 11. The embodiment of FIG. 12 provides a novel current mirror having a high output resistance and a significantly reduced $V_{satmin}$ as compared with the prior art high output resistance current mirrors, and which is compact and is substantially unaffected by variations in process or changes in operating temperature.

Figure 13:
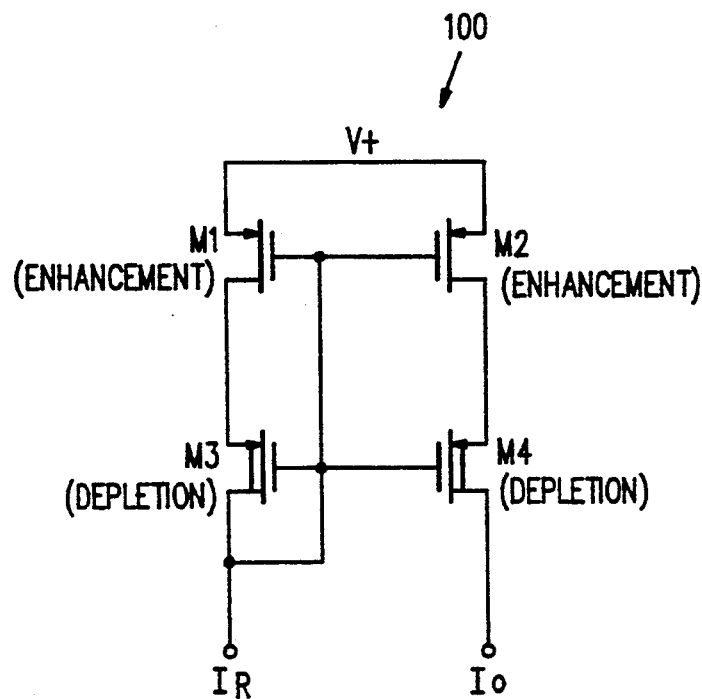

FIG. 13 shows an alternative embodiment of an improved current mirror constructed in accordance with the principles of this invention. Enhancement-depletion mode cascode current mirror 100 utilizes enhancement mode P channel transistors $M_1$ and $M_2$ as the "current mirror" transistors, and depletion mode P channel transistors $M_3$ and $M_4$ as the "cascode" transistors. With the gate and drain of depletion mode P channel transistor $M_3$ connected together, transistor $M_3$ operates as a diode-connected depletion transistor connected between the gate and drain of current reference transistor $M_1$. $V_T+dV$ of transistor $M_3$ is close to zero. With diode-connected depletion $M_3$ transistor and depletion cascode transistor $M_4$, the drains of transistors $M_1$ and $M_2$ are maintained at the same voltage. The mirror of FIG. 13 is fully active (i.e. operating as an effective cascode current mirror) down to $dV_4+dV_2$, and therefore transistors $M_4$ and $M_2$ have a very small $V_{satmin}$. Transistors $M_1$ and $M_2$ are maintained in saturation even when the threshold voltage $V_{te}$ of enhancement mode transistors $M_2$ and $M_1$ fail to track $V_{td}$ of depletion mode transistors $M_4$ and $M_3$ over temperature and process variations. Furthermore, circuit layout is greatly simplified and made more compact by the fact that the gates of transistors $M_1$ through $M_4$ are all connected together, as well as minimizing the need to make contacts to source-drain regions.

Moreover, it is envisioned as within the scope of this invention to provide a large channel width to channel length ratio W/L in the fabrication of transistors M3 and M4, to further lower the saturation voltage of current mirror 100. It is also envisioned as within the scope of this invention to use enhancement mode N channel transistors as "current mirror" transistors M1 and M2, while using depletion mode N channel transistors as "cascode" transistors M3 and M4.

Figure 14:
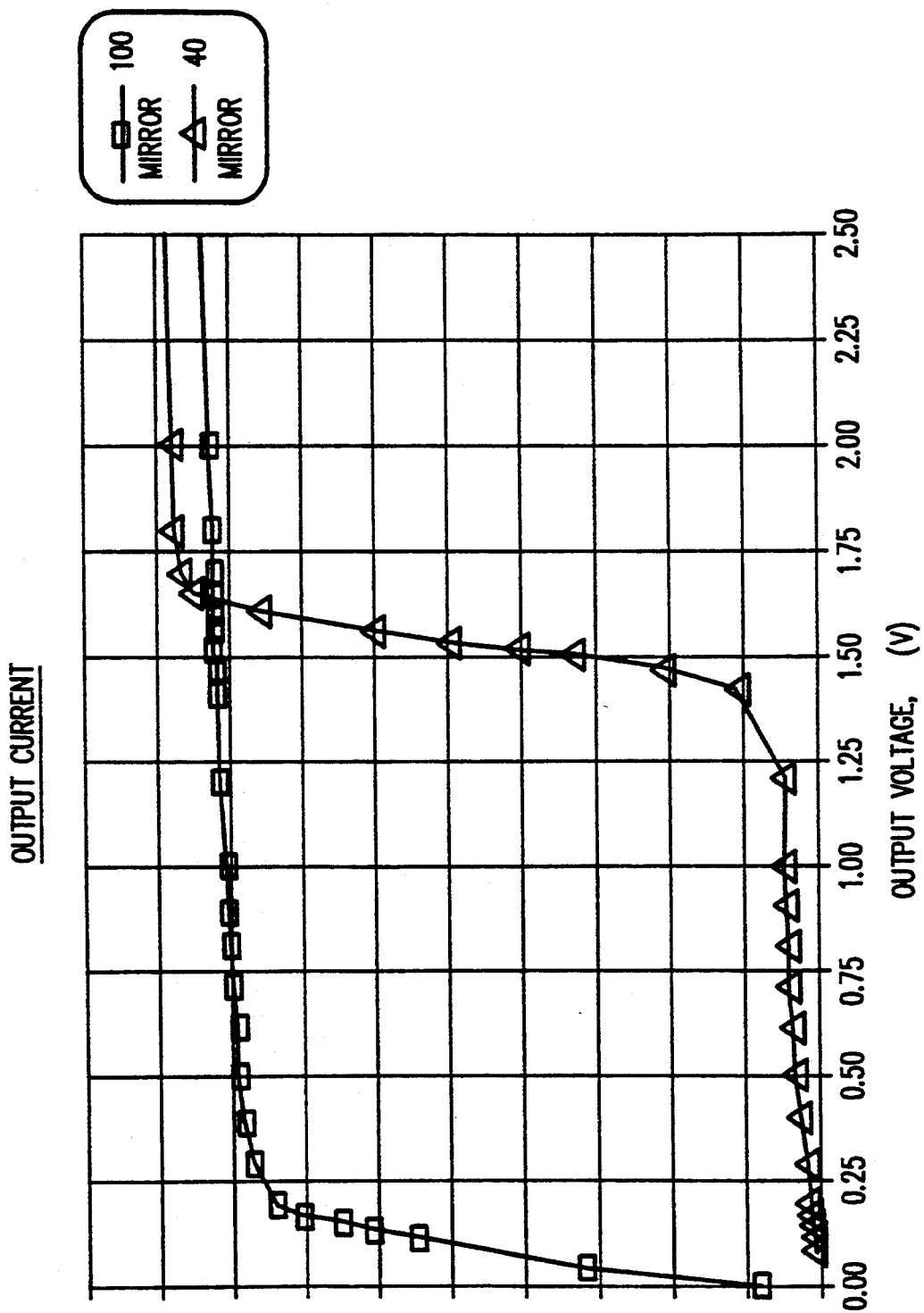
FIG. 14 shows a graphical comparison of the output current to the output voltage of a current mirror constructed in accordance with the principles of this invention.

FIG. 14 provides a graphical illustration of the high output impedance, achieved by current mirror 100, as compared to the high impedance, higher Vsatmin of a typical prior art current mirror such as current mirror 40 of FIG. 4. By utilizing both enhancement mode and depletion mode devices in current mirror 100, an improved current mirror circuit is provided which results in higher output impedance, lower Vsatmin and less sensitivity to process variation in the fabrication of the circuit devices, while easing layout considerations and achieving highly dense circuit layout.

Figure 15:
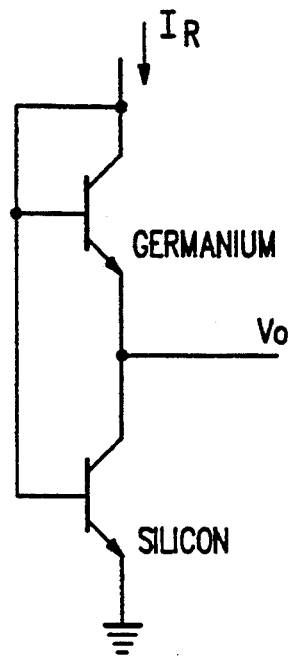
FIG. 15 is a schematic diagram of a prior art bipolar voltage reference.
Figure 16:
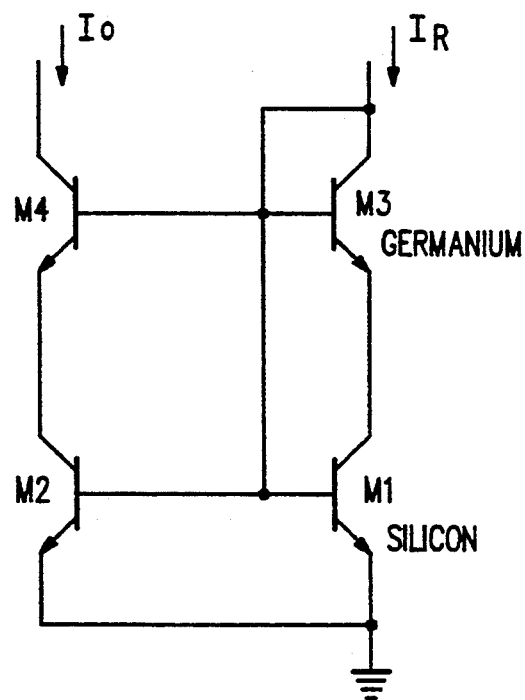
FIG. 16 is a schematic diagram of one embodiment of a bipolar current mirror constructed in accordance with this invention.

FIG. 16 is a schematic diagram of one embodiment of a current mirror of this invention fabricated utilizing bipolar transistors, which is an improvement over the prior art voltage reference of FIG. 15. Germanium transistors M3 and M4 serve the equivalent function of depletion transistors M3 and M4 in the MOS embodiment of FIG. 14. Similarly, silicon transistors M1 and M2 serve the equivalent purpose of enhancement transistors M1 and M2 of the MOS embodiment of FIG. 13. Thus, the embodiment of FIG. 16 provides a bipolar current mirror having the advantages of high output impedance and low $V_{satmin}$.

Table I characterizes various attributes of the prior art current mirrors of FIGS. 1–10 and the embodiments of the novel current mirrors of this invention which are depicted in FIGS. 11–13 and 16.

TABLE I

COMPARISON OF CURRENT MIRRORS-SOURCES
dV = Vgs-Vt, Vte = Vt(enhancement), Vtd = Vt(depletion)

| Fig. # | Minimum Saturation Voltage | Output Impedance | Comments-drawbacks good qualities |
|---|---|---|---|
| 1 | dV | low Z | simple current mirror |
| 2 | Vte + 2 dV | high Z | Wilson mirror, poor matching |
| 3 | Vte + 2 dV | high Z | Modified Wilson mirror, good matching |
| 4 | 2 dV | high Z | Cascode current mirror, large voltage drop on reference side |
| 5, 6 | 2 dV | high Z | requires additional bias circuit, current source matches well |
| 7 | 2 dV | high Z | depends on process and temperature |
| 8 | 2 dV | high Z | requires additional bias circuit, current source matches poorly over temperature |
| 11 | Vtd + 2 dV | high Z | Modified Wilson mirror, matching with depletion-enhancement devices |
| 12 | 2 dV | high Z | Cascode current mirror, with depletion-enhancement devices, low voltage drop on reference side |
| 13 | 2 dV | high Z | process-temperature insensitive (but needs a depletion device) |
| 16 | 2 dV$_{sat}$ | high Z (at low temp) | leakage currents a problem, two different technologies |

The invention now being fully described, it will be apparent to one of ordinary skill in the art that many changes and modifications can be made thereto without departing from the spirit or scope of the appended claims.

What is claimed is:

1. A current mirror circuit comprising:
   a first enhancement mode MOS transistor having a source, a gate, and a drain;
   a second enhancement mode MOS transistor having a source, a gate, and a drain;
   a third depletion mode MOS transistor having a source, a gate, and a drain;
   a fourth depletion mode MOS transistor having a source, a gate, and a drain;
   wherein the source of the first transistor and the source of the second transistor are coupled to a common voltage source;
   the drain of the first transistor is coupled to the source of the third transistor, and the drain of the second transistor is coupled to the source of the fourth transistor;
   the gate of the first transistor is coupled to the gate of the second transistor, the gate of the third transistor, and the gate of the fourth transistor; and
   wherein the gate of the third transistor is also coupled to the drain of the third transistor to cause the third transistor to provide a voltage drop between the drain of the first transistor and the gate of the first transistor, maintaining the drain of the first transistor and the drain of the second transistor at a similar voltage to generate an output current through the second and the fourth transistor.

2. A current mirror as in claim 1 wherein the first and the second transistors have substantially equal threshold voltages, and the third and the fourth transistors have substantially equal threshold voltages.

3. A current mirror circuit comprising:
   a first bipolar transistor having a collector, a base, and an emitter, and having a threshold voltage;
   a second bipolar transistor having a collector, a base, and an emitter, and having a threshold voltage;
   a third bipolar transistor having a collector, a base, and an emitter, and having a threshold voltage lower than said threshold voltage of said first bipolar transistor;
   a fourth bipolar transistor having a collector, a base, and an emitter, and having a threshold voltage lower than said threshold voltage of said second bipolar transistor;
   wherein the emitter of the first transistor and the emitter of the second transistor are coupled to a common ground;
   the collector of the first transistor is coupled to the emitter of the third transistor, and the collector of the second transistor is coupled to the emitter of the fourth transistor;
   the base of the first transistor is coupled to the base of the second transistor, the base of the third transistor, and the base of the fourth transistor; and
   wherein the base of the third transistor is also coupled to the collector of the third transistor to cause the third transistor to operate as a diode between the collector of the first transistor and the base of the first transistor, maintaining the collector of the first transistor and the collector of the second transistor at a similar voltage to generate an output current through the second and the fourth transistor.

4. A current mirror as in claim 3 wherein the first transistor and the second transistor comprise silicon, and the third transistor and the fourth transistor comprise germanium.

5. A current mirror of claim 3 wherein the threshold voltages of said first and second bipolar transistors are substantially equal, and the threshold voltages of said third and fourth bipolar transistors are substantially equal.

6. A current mirror as in claim 5 wherein the first transistor and the second transistor comprise silicon, and the third transistor and the fourth transistor comprise germanium.

7. A current mirror circuit comprising:
a first enhancement mode MOS transistor having a source, a gate, and a drain;
a second enhancement mode MOS transistor having a source, a gate, and a drain;
a third depletion mode MOS transistor having a source, a gate, and a drain;
a fourth depletion mode MOS transistor having a source, a gate, and a drain;
wherein the source of the first transistor and the source of the second transistor are coupled to a common voltage source;
the drain of the first transistor is coupled to the source of the third transistor, and the drain of the second transistor is coupled to the source of the fourth transistor;
the gate of the first transistor is coupled to the gate of the second transistor, and the gate of the second transistor is also coupled to the drain of the second transistor to provide a first voltage drop between the common voltage source and the gate of the first transistor; and
wherein the gate of the third transistor is coupled to the gate of the fourth transistor, and the gate of the third transistor is also coupled to the drain of the third transistor to cause the third transistor to provide a second voltage drop between the drain of the first transistor and the gate of the fourth transistor, maintaining the drain of the first transistor and the drain of the second transistor at a similar voltage to generate an output current through the second and the fourth transistor.

8. A current mirror as in claim 7 wherein the first and the second transistors have substantially equal threshold voltages, and the third and the fourth transistors have substantially equal threshold voltages.

9. A current mirror circuit comprising:
a first bipolar transistor having a collector, a base, and a emitter, and having a threshold voltage;
a second bipolar transistor having a collector, a base, and a emitter, and having a threshold voltage;
a third bipolar transistor having a collector, a base, and a emitter, and having a threshold voltage less than said threshold voltage of said first bipolar transistor;
a fourth bipolar transistor having a collector, a base, and a emitter, and having a threshold voltage less than said threshold voltage of said second bipolar transistor;
wherein the emitter of the first transistor and the emitter of the second transistor are coupled to a common ground;
the collector of the first transistor is coupled to the emitter of the third transistor, and the collector of the second transistor is coupled to the emitter of the fourth transistor;
the base of the first transistor is coupled to the base of the second transistor, and the base of the second transistor is also coupled to the collector of the second transistor to operate between the common voltage source and the base of the first transistor; and
wherein the base of the third transistor is coupled to the base of the fourth transistor, and the base of the third transistor is also coupled to the collector of the third transistor to cause the third transistor to operate between the collector of the first transistor and the base of the fourth transistor, maintaining the collector of the first transistor and the collector of the second transistor at a similar voltage to generate an output current through the second and the fourth transistor.

10. A current mirror as in claim 9 wherein the first transistor and the second transistor comprise silicon, and the third transistor and the fourth transistor comprise germanium.

11. A current mirror of claim 9 wherein said threshold voltages of the first and the second bipolar transistors are substantially equal, and said threshold voltages of the third and the fourth bipolar transistors are substantially equal.

12. A current mirror as in claim 11 wherein the first transistor and the second transistor comprise silicon, and the third transistor and the fourth transistor comprise germanium.

13. A current mirror circuit comprising:
a first enhancement mode MOS transistor having a source, a gate, and a drain;
a second enhancement mode MOS transistor having a source, a gate, and a drain;
a third depletion mode MOS transistor having a source, a gate, and a drain;
a fourth depletion mode MOS transistor having a source, a gate, and a drain;
wherein the source of the first transistor and the source of the second transistor are coupled to a common voltage source;
the drain of the first transistor is coupled to the source of the third transistor, and the drain of the second transistor is coupled to the source of the fourth transistor;
the gate of the first transistor is coupled to the gate of the second transistor, and the gate of the first transistor is also coupled to the drain of the first transistor to provide a first voltage drop between the common voltage source and the gate of the second transistor; and
wherein the gate of the third transistor is coupled to the gate of the fourth transistor, and the gate of the third transistor is also coupled to the drain of the third transistor to cause the third transistor to provide a second voltage drop between the drain of the first transistor and the gate of the fourth transistor, maintaining the drain of the first transistor and the drain of the second transistor at a similar voltage to generate an output current through the second and the fourth transistor.

14. A current mirror as in claim 13 wherein the first and the second transistors have substantially equal threshold voltages, and the third and the fourth transistors have substantially equal threshold voltages.

15. A current mirror circuit comprising:
a first bipolar transistor having a collector, a base, and a emitter, and having a threshold voltage;

a second bipolar transistor having a collector, a base, and a emitter, and having a threshold voltage;

a third bipolar transistor having a collector, a base, and a emitter, and having a threshold voltage less than said threshold voltage of said first bipolar transistor;

a fourth bipolar transistor having a collector, a base, and a emitter, and having a threshold voltage less than said threshold voltage of said second bipolar transistor;

wherein the emitter of the first transistor and the emitter of the second transistor are coupled to a common ground;

the collector of the first transistor is coupled to the emitter of the third transistor, and the collector of the second transistor is coupled to the emitter of the fourth transistor;

the base of the first transistor is coupled to the base of the second transistor, and the base of the first transistor is also coupled to the collector of the first transistor to operate between the common voltage source and the base of the second transistor; and wherein the base of the third transistor is coupled to the base of the fourth transistor, and the base of the third transistor is also coupled to the collector of the third transistor to cause the third transistor to operate between the collector of the first transistor and the base of the fourth transistor, maintaining the collector of the first transistor and the collector of the second transistor at a similar voltage to generate an output current through the second and the fourth transistor.

16. A current mirror as in claim 15 wherein the first transistor and the second transistor comprise silicon, and the third transistor and the fourth transistor comprise germanium.

17. A current mirror of claim 15 wherein said threshold voltages of the first and the second bipolar transistors are substantially equal, and said threshold voltages of the third and the fourth bipolar transistors are substantially equal.

18. A current mirror as in claim 17 wherein the first transistor and the second transistor comprise silicon, and the third transistor and the fourth transistor comprise germanium.

* * * * *